(12) United States Patent
Jeon et al.

(10) Patent No.: US 6,825,413 B2
(45) Date of Patent: Nov. 30, 2004

(54) DOOR MOUNTING STRUCTURE

(75) Inventors: Hong-Jin Jeon, Incheon (KR); Seok-Han Yun, Suwon-si (KR)

(73) Assignee: Trigen Computer, Inc. (KR)

( * ) Notice: Subject to any disclaimer, the term of this patent is extended or adjusted under 35 U.S.C. 154(b) by 0 days.

(21) Appl. No.: 10/402,262

(22) Filed: Mar. 28, 2003

(65) Prior Publication Data

US 2003/0184977 A1 Oct. 2, 2003

(30) Foreign Application Priority Data

Mar. 29, 2002 (KR) .................................. 20-2002-0009476

(51) Int. Cl.[7] ................................................ H02G 3/08
(52) U.S. Cl. ..................... 174/50; 174/35 R; 174/58; 361/695
(58) Field of Search .................... 174/50, 35 R, 174/58; 312/223.1, 139.2; 361/695, 688

(56) References Cited

U.S. PATENT DOCUMENTS 5,479,341 A * 12/1995 Pihl et al. ..................... 700/79
5,569,878 A * 10/1996 Zielinski ..................... 174/35 R
6,022,271 A * 2/2000 Biondo ........................ 454/369
6,152,549 A * 11/2000 Goto et al. ............... 312/223.1
6,301,108 B1 * 10/2001 Stockbridge ................ 361/688
6,560,106 B2 * 5/2003 Ivey et al. ................... 361/695

* cited by examiner

*Primary Examiner*—Dhiru R Patel
(74) *Attorney, Agent, or Firm*—Cantor Colburn LLP

(57) ABSTRACT

A door mounting structure using a guide rail, capable of guiding movement of a door and minimizing the space occupied for opening and closing the door, is provided. The door mounting structure includes a case panel forming part of a case, a door to partially close the case panel, at least one guide protrusion formed in the door, and at least one guide rail guiding the guide protrusion to move the door inside of the case. According to the present invention, the door size has minimal effect on the internal layout of the computer case, thereby increasing the degree of freedom for designing. Also the door can be fixed at arbitrary position while being opened due to friction between a door boss and the guide rail.

8 Claims, 10 Drawing Sheets

DOOR MOUNTING STRUCTURE

TECHNICAL FIELD

The present invention relates to a door mounting structure, and more particularly to the door mounting structure using a guide rail that guides the movement of a door and minimizes the space occupied for opening and closing the door.

BACKGROUND OF THE INVENTION

The user interface part of devices such as computer, television and refrigerator is generally located outside on the front. Furthermore, some user interface parts are located at a lower place on the outside front but usually somewhat recessed on the device, and covered by a door or lid.

For an example, a television set typically has a control panel door to cover the user interface that consists of a control panel including the power, channel and volume switches, and the user interface is located below the external case with certain depth. This user interface is usually located in a recessed area in a lower area of the outside casing. Such a structure like a control panel door that covers the switches is very useful to protect the switches from dust, debris, and damage along with providing a beautiful appearance.

For a computer case, a panel door covering the power switch, reset switch, and other switches is quite commonly used. Connecting ports such as video in/output ports, audio in/output ports, mouse port and keyboard ports can be situated in the front panel of case, and covered by a door that can be opened or closed.

FIG. 1 is the perspective view of conventional computer case that illustrates the door used in computer case. FIG. 2 is cross sectional view of the computer to illustrate the door mounting structure.

In FIGS. 1 and 2, conventional door mounting structure is rotational type. Namely, the door mounting structure consists of case panel 10 which is a part of a computer case, door 20 partially covering the case panel 10, and the door rotation axis 30 that is mounted inside of the case by certain gap from the case panel. In the mounting structure, the door rotation axis 30 includes two rotation protrusions which is a part of the door 20 and the protrusion receiver formed inside of the case panel which corresponds the rotation protrusion.

The conventional door 20 rotates about the rotational axis 30 to open or close the part of the case panel 10. Using the rotational type device, a designer must consider the moving contour of the door while arranging the inner parts of a computer system to avoid interfering the door's movement. In particular, as the size of the door 20 increases the rotation axis 30 should be positioned inside of the case panel at a greater depth from the case panel. Therefore, the moving contour of the door requires greater space, thereby limiting the degree of freedom to design a case under normal circumstances. Finally, because the rotation-type door is also difficult to fix at an arbitrary angle, the user must open or close the door completely, which is a disadvantage.

SUMMARY OF THE INVENTION

It is an object of the present invention to provide the door mounting structure that can minimize the inner space of a computer case for door mounting.

It is another object of the present invention to provide the door mounting structure that is easy to open, close and manufacture.

It is still another object of the present invention to provide the door mounting structure that can be fixed at an arbitrary angle to control the extent to which the door remains open when opening the door.

To accomplish the objects of the present invention, a door mounting structure is provided that consists of a case panel forming part of the case, a door to partially close the case panel, at least one guide protrusion formed in the door, and at least one guide rail which guides the guide protrusion respectively to move inside the case.

The user interface is mounted in the case panel at a certain depth from the outer face of the case panel, and the door is arranged in the case panel to open or cover the case panel by the door's movement. At least one guide rail is formed in the case panel, and the guide protrusion formed in the door moves along the guide rail. As the guide protrusion moves, the door also moves.

Preferably, the guide protrusions are formed in both sides of the door. The guide protrusions are arranged in a straight line, and they can move in the perpendicular direction to the line. Also, the guide protrusions can form plural axes with a gap in the direction of the door's movement.

Furthermore, it is preferable that a pair of the first guide protrusions are arranged in a straight line to form an axis, and a pair of the second guide protrusions in another straight line to form another axis. As a result of forming two axes, each axis formed by protrusions prevents another axis from rotating. Thus, the door moves along the designed tracing path without rotating.

The door can be arranged at arbitrary angle inside of the case panel. The angle depends on the shape and arrangement of the guide rails, and can be modified into the optimal angle according to layout of the internal parts of the case. It is desired that the door should be arranged parallel to the inner face of the case panel, because the inner space of the case can be maximized with such arrangement.

A platform can be formed between the guide protrusion and a door boss, and the door boss is formed to have a width greater than the guide protrusion. The guide protrusion and door can be stopped or fixed at arbitrary position on the guide rail due to the friction force between the door boss and the circumference of the guide rail. While the conventional rotation-type door cannot be fixed at arbitrary position, the door of the present invention can be fixed at arbitrary position and opened partially or completely as desired. Also, intermediate stopper can be formed on the guide rail with an interval, which enables the user to control the extent of the door opening stepwise.

A stopper can be formed in the ends of the guide rail to keep the door open when the door is fully opened. The stopper can be formed as a elastic parts to secure the guide protrusions, or curved part that is formed by bending the ends of the guide rails.

BRIEF DESCRIPTION OF THE DRAWINGS

The above objects and other advantages of the present invention will become more apparent by detailed describing preferred embodiments thereof with reference to the attached drawings in which.

EMBODIMENTS

Hereinafter, preferred embodiments of the present invention will be described in more detail with reference to the accompanying drawings, but it is understood that the present invention should not be limited to the following embodiments.

Figure 1:
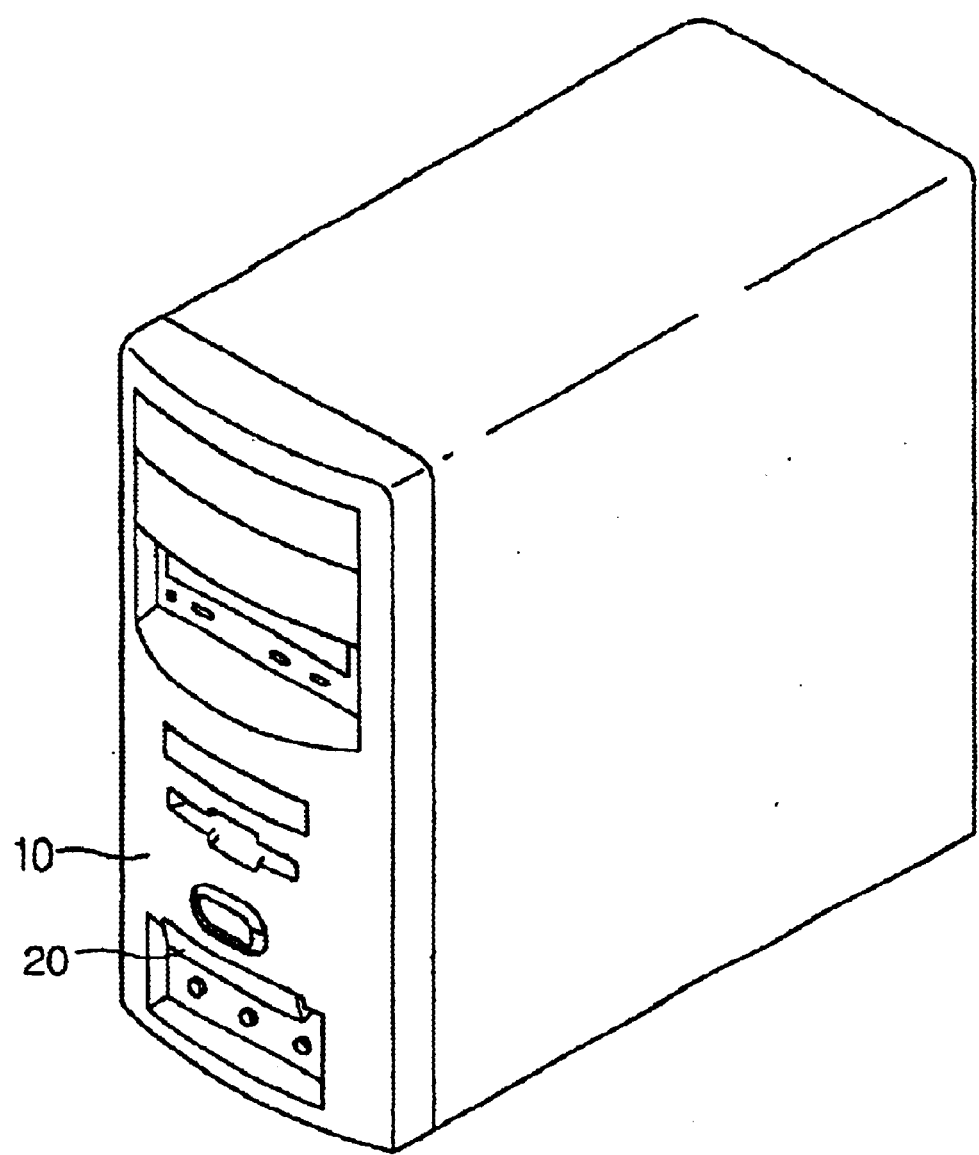
FIG. 1 is a perspective view for showing the door of conventional computer case.
Figure 2:
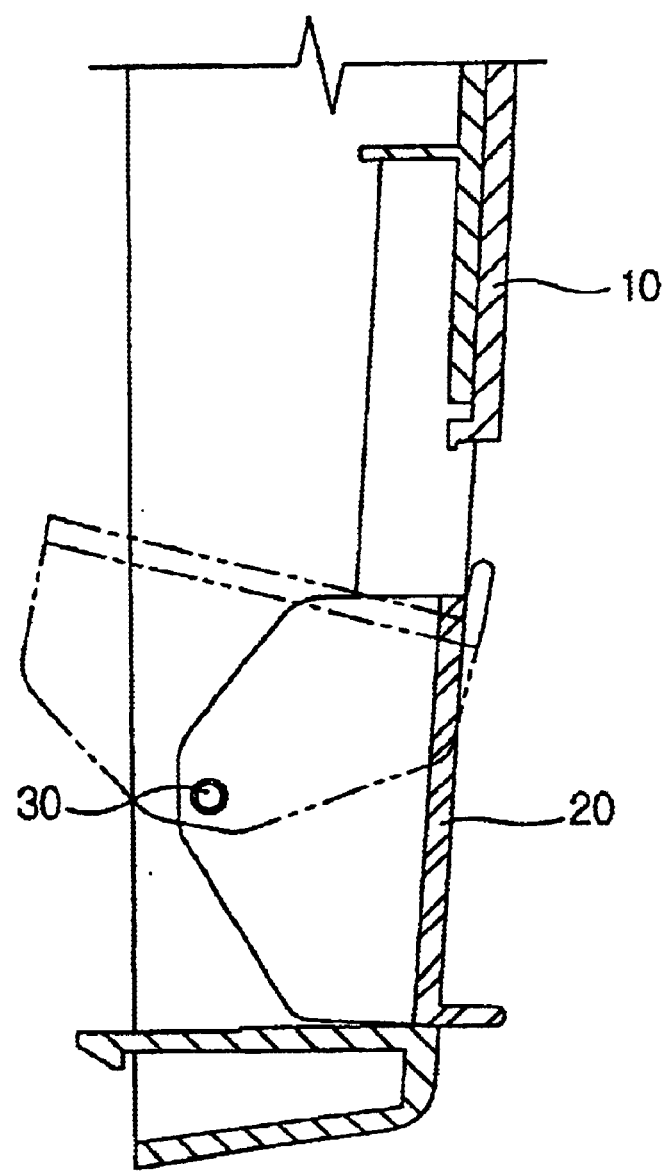
FIG. 2 is the cross sectional view of the door in FIG. 1.
Figure 3:
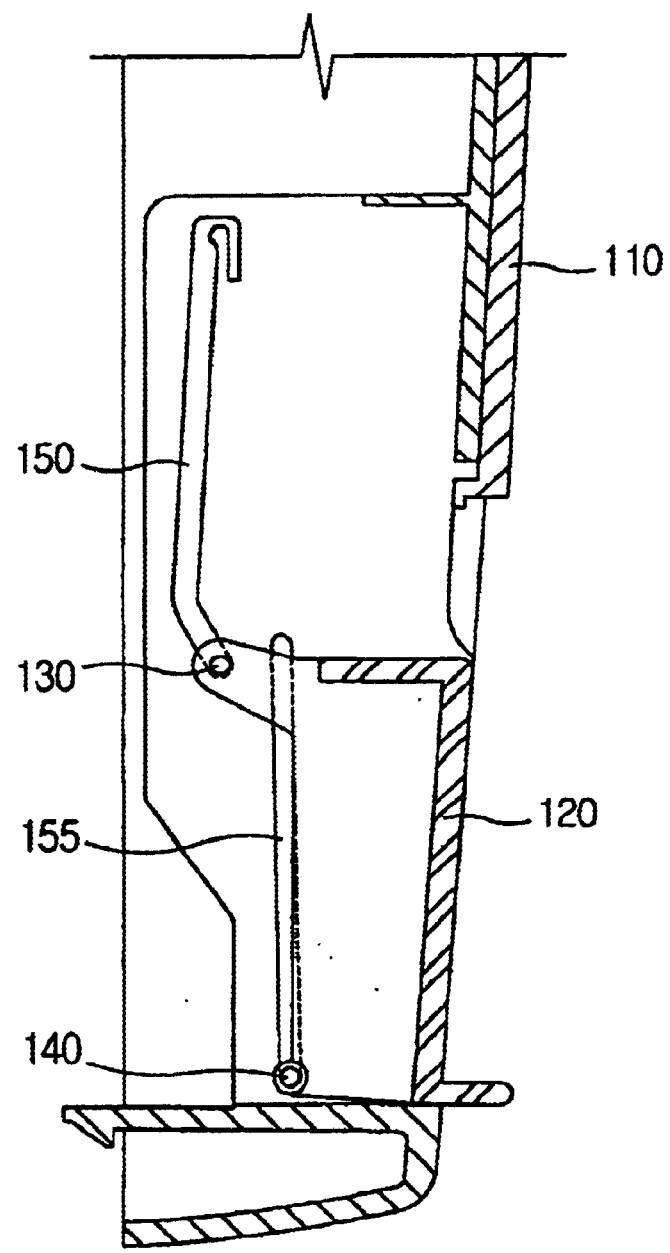
FIG. 3 is the cross sectional view for illustrating the door mounting structure according to the first embodiment of the present invention.
Figure 4:
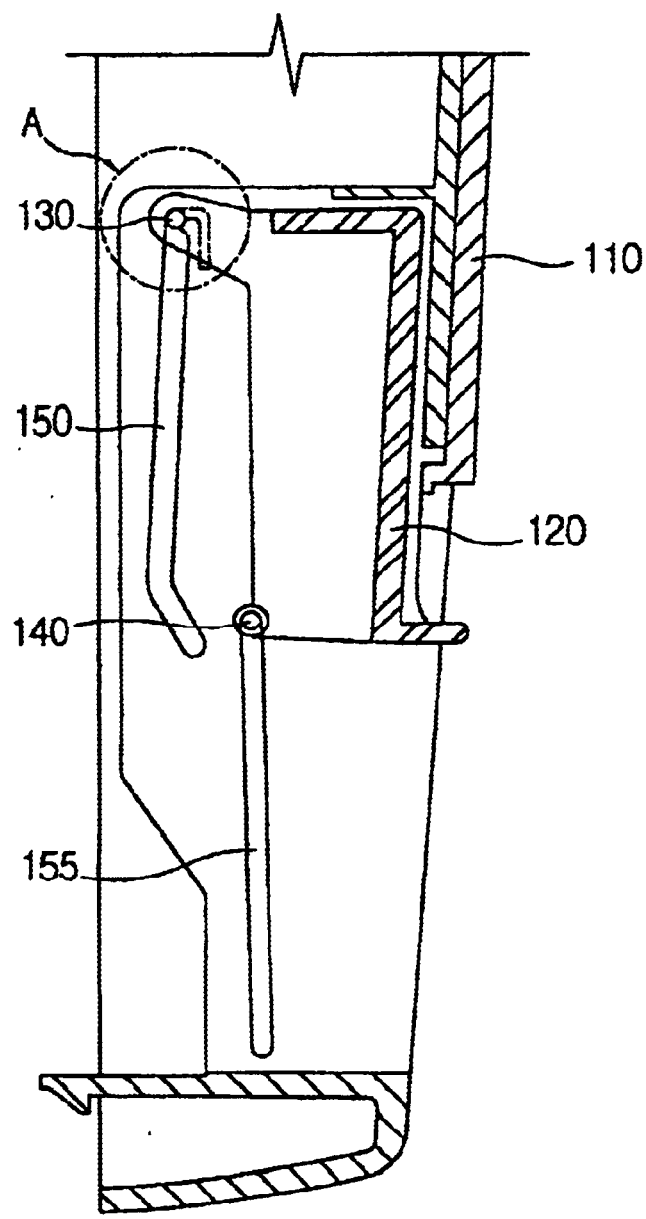
FIG. 4 is the cross sectional view for illustrating the open door in FIG. 3.
Figure 8:
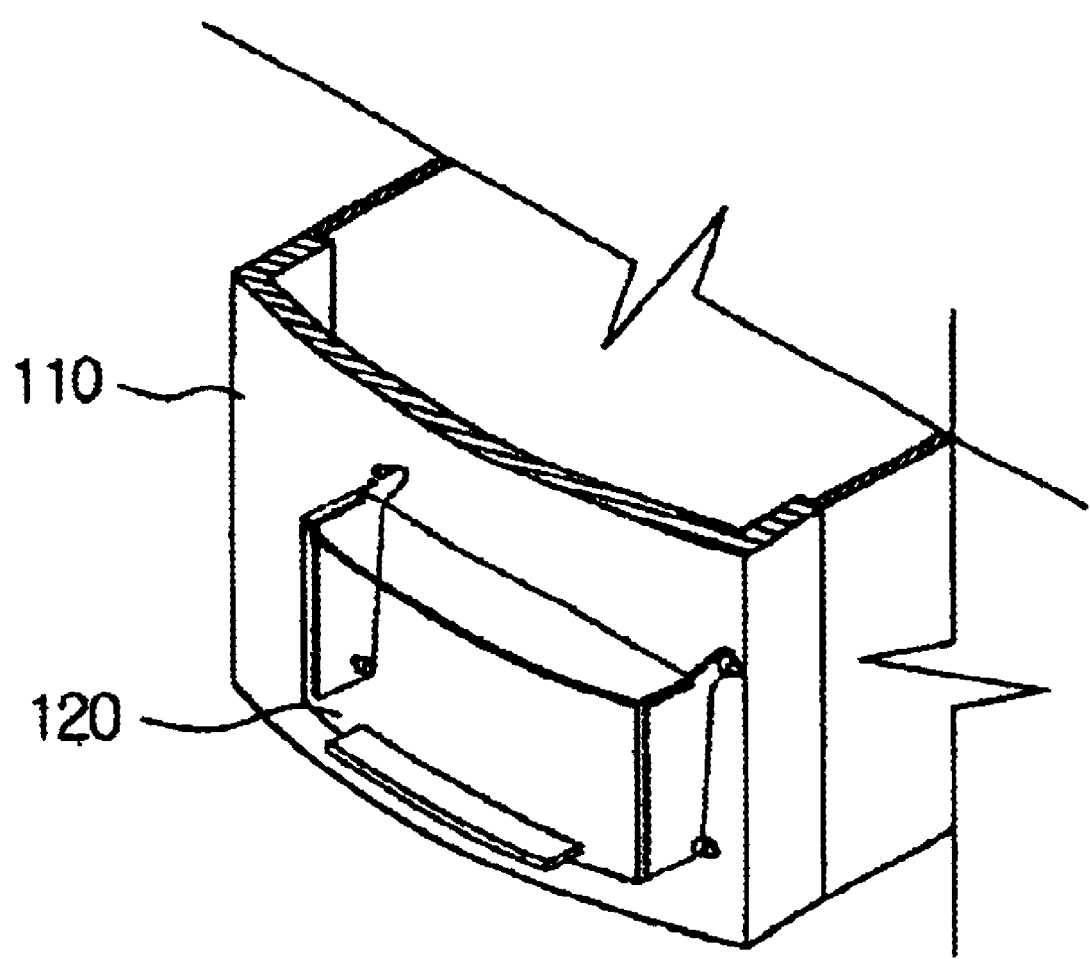
FIG. 8 is a perspective view of the door mounting structure according to the first embodiment of the present invention.
Figure 9:
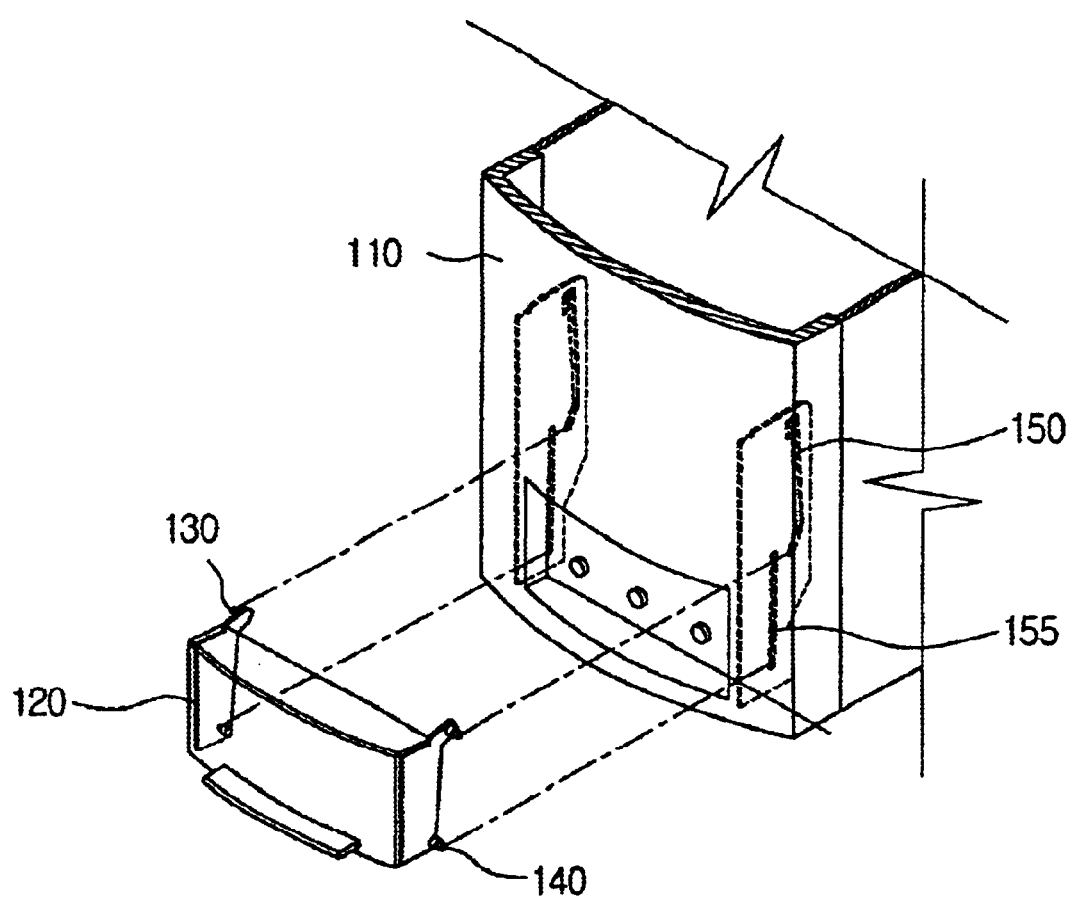
FIG. 9 is a diagrammatic exploded view illustrating the door mounting structure according to the first embodiment of the present invention.

FIG. 3 is the cross sectional view for illustrating the door mounting structure according to the first embodiment of the present invention, FIG. 4 is the cross sectional view for illustrating the open door in FIG. 3. FIG. 8 is a perspective view of the door mounting structure, and FIG. 9 is a diagrammatic exploded view illustrating the door mounting structure.

Referring to the FIGS. 3–4 and 8–9, the door mounting structure 100 according to the first embodiment of the present invention consists of the case panel 110 forming a part of a case, door 120 for partially closing the case panel, the first guide protrusions 130 formed in a body with the door 120 and extended outward from the both sides of the door 120, the second guide protrusions 140 having a gap with the first guide protrusions 130 which are formed in a body with the door 120 and extended outward from the both sides of the door 120, the first guide rails 150 guiding the first guide protrusions 130, and the second guide rails 155 guiding the second guide protrusions 140.

The first guide protrusions 130 and the second guide protrusions 140 move respectively guided by the first guide rails 150 and the second guide rails 155, allowing the 120 to slide vertically. Since the door 120 is arranged parallel to rear face of the case panel 110, the user interface located inside of the case panel 110 is opened.

Because the door 120 moves vertically, the size of the door 120 has little effect on the internal layout of the case. The space occupied by the door 120 is relatively small, because the door 120 moves adjacently to the inner face of the case panel 110. Such feature becomes apparent comparing with the conventional door mounting structure.

Figure 5:
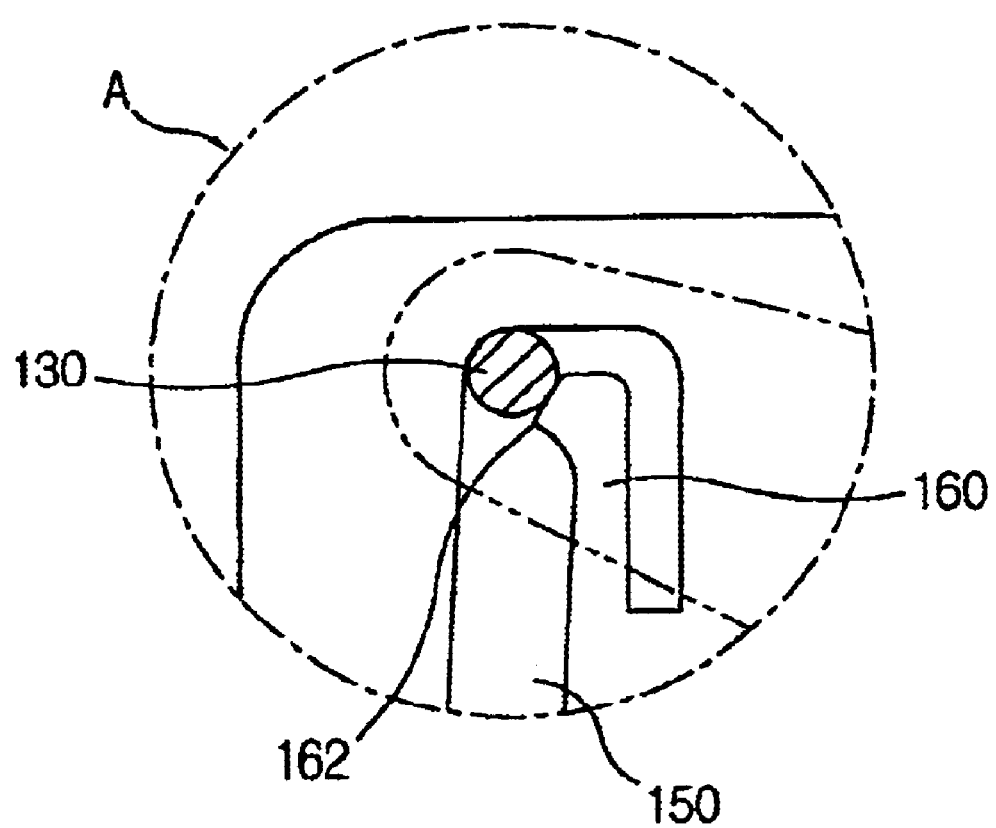
FIG. 5 is the enlarged cross sectional view of the encircled area designate as "A" in FIG. 4.

FIG. 5 is the enlarged cross sectional view of the encircled area designated as "A" in FIG. 4

Referring to FIG. 5, the stopper 160 includes the elastic part formed in the ends of the first guide rails 150. The stopper 160 shaped into a beam forms an engaging protrusion 162, and the first guide protrusion 130 passing the engaging protrusion 162 is restricted by the stopper 160.

The stoppers 160 are formed on the both sides of the door 120, so the door 120 remains open due to the stopper 160 even after being completely opened. In the first embodiment, the stoppers 160 are formed on the both of the first guide rails 150, but the stoppers 160 can be also formed in the ends of the second guide rail 155. Alternatively, the stopper 160 can be formed on the guide rail 150 at an interval to control the extent to which the door 120 is open stepwise by securing the guide protrusion 130 stepwise.

Figure 6:
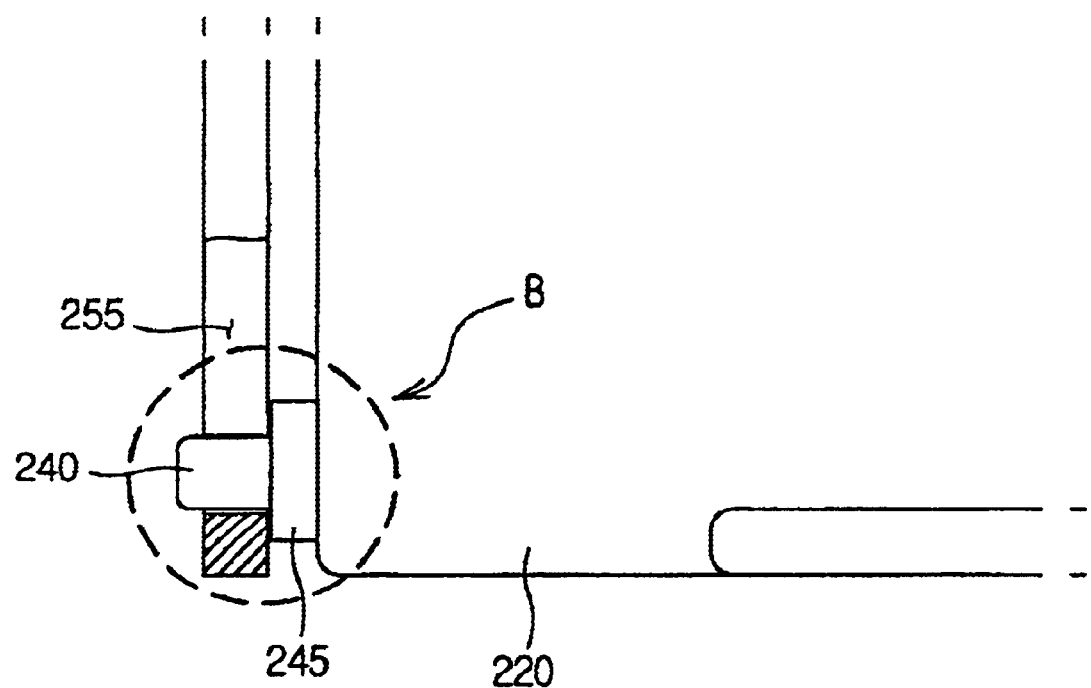
FIG. 6 is the enlarged cross sectional view of the guide protrusion for illustrating the door mounting structure according to the second embodiment of the present invention.
Figure 10:
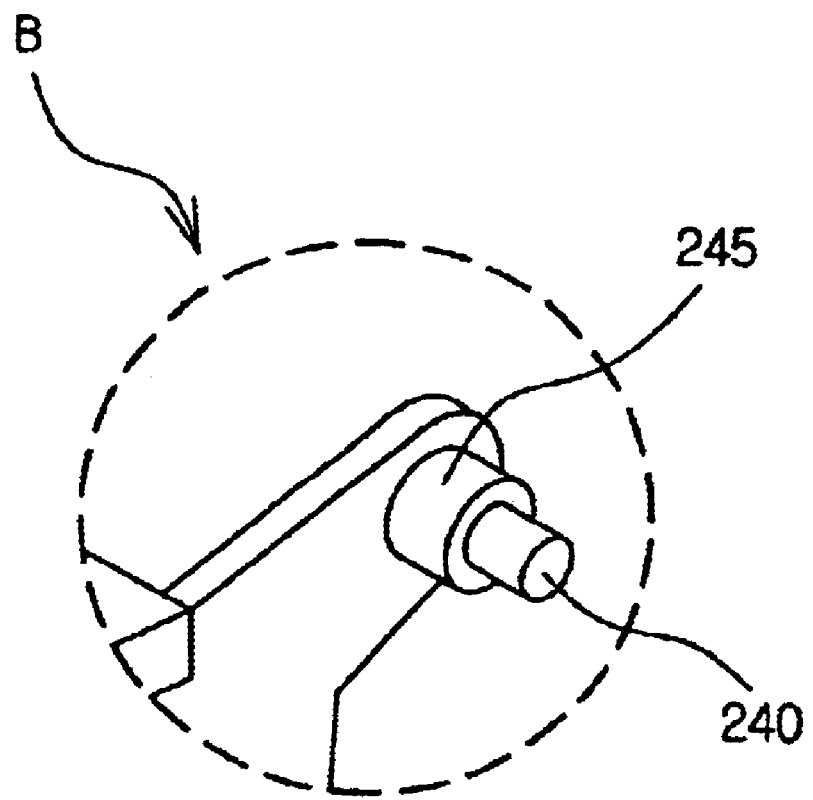
FIG. 10 is an enlarged perspective view of the encircled area "B" of FIG. 6.

FIG. 6 is the enlarged cross sectional view of the guide protrusion for illustrating the door mounting structure according to the second embodiment of the present invention, and FIG. 10 is an enlarged perspective view of the encircled area "B" of FIG. 6.

Referring to FIGS. 6 and 10, the door mounting structure according to the second embodiment of the present invention consists of the case panel, door 220, the first guide protrusions extended outward from the both sides of the door 220, the second guide protrusions 240 having a gap with the first guide protrusions and extended outward from the both sides of the door 220, the first guide rails guiding the first guide protrusions, and the second guide rails 255 guiding the second guide protrusions.

The door mounting structure in the second embodiment has substantially same structure, shape and function as in the first embodiment, so the detailed description will be omitted.

However, the door mounting structure in the second embodiment includes door boss 245 that has a greater width than the second guide protrusion 240 and formed between the second guide protrusion 240 and door 220. The door boss 245 is formed around the second guide protrusion 240 to form a platform around the second guide protrusion 240. Thus, the face of the door boss 245 presses against the circumference of the second guide rail 255 causing friction. The friction force caused by a door boss 245 enables the user of the door 220 that can be fixed at an arbitrary position to control the extent to which the door 220 remains open after being manipulated by the user.

Figure 7:
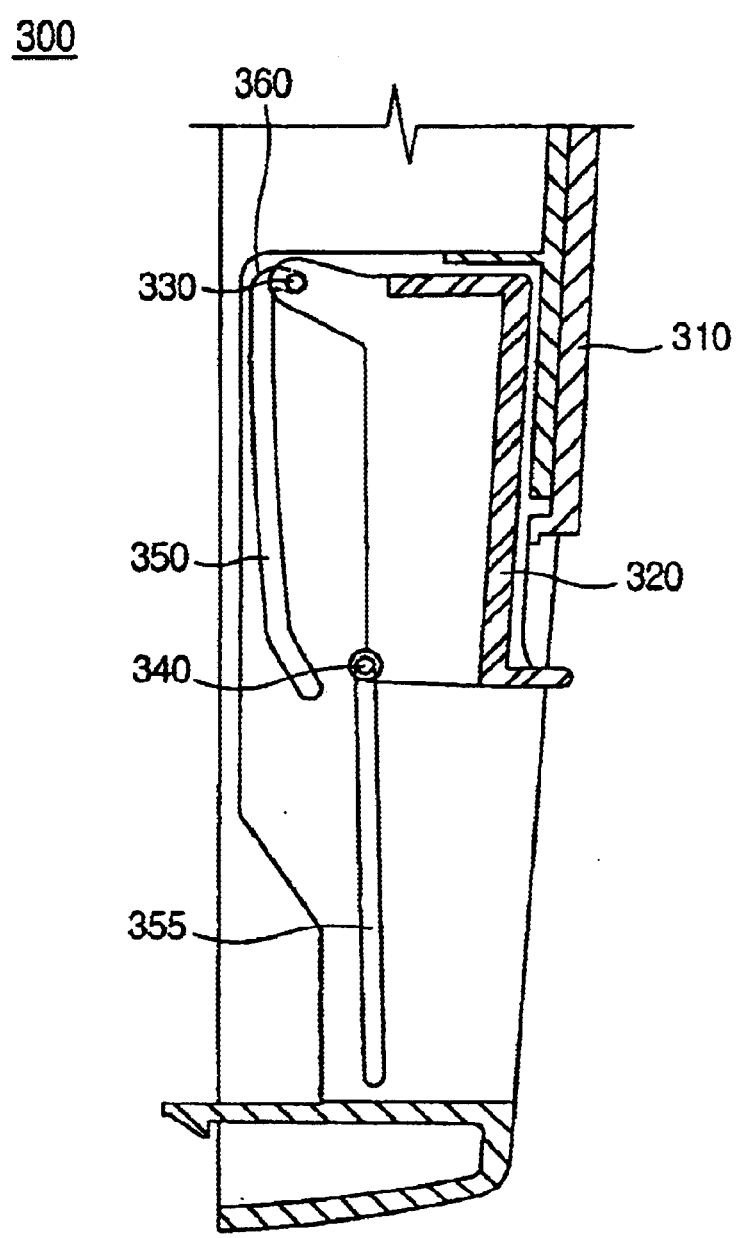
FIG. 7 is the cross sectional view for illustrating the door mounting structure according to the third embodiment of the present invention.

FIG. 7 is the cross sectional view for illustrating the door mounting structure according to the third embodiment of the present invention.

Referring to FIG. 7, the door mounting structure according to the third embodiment of the present invention consists of the case panel 310, door 320, the first guide protrusions 330 extended outward from the both sides of the door 320, the second guide protrusions 340 having a gap with the first guide protrusions 330 and extended outward from the both sides of the door 320, the first guide rails 350 guiding the first guide protrusions 330 and forming the curved part 360 at the end thereof, and the second guide rails 355 guiding the second guide protrusions 340.

The first guide protrusions 330 and the second guide protrusions 340 move respectively guided by the first guide rails 350 and the second guide rails 355, which result in the door 320 sliding vertically. Since the door 320 is arranged parallel to rear face of the case panel 310, the user interface located inside of the case panel 310 is opened.

The curved part 360 is formed as a stopper on the both sides of the door 320, so the door 320 remains open due to the curved part 360 after being completely opened with the first guide protrusion 330 engaged in the curved part 360. It is desirable that the curved part 360 is formed on the first guide rail 350, but the curved part 360 may be formed on the end of the second guide rail 355.

It is also possible to fix the door 320 at arbitrary position by forming the door boss(not shown) as in the second embodiment. The door boss can be formed around the second guide protrusion 340 to form a platform around the second guide protrusion 340. Thus, the face of the door boss presses against the circumference of the second guide rail 355 causing friction. The friction caused by the door boss enables the user of the door 320 fixed at an arbitrary position to control the extent to which the door 320 remains open after being manipulated by the user.

According to the present invention as described above, the door size has minimal effect on the internal layout of the computer case, thereby increasing the degree of freedom to design a case under normal circumstances Also the door can be fixed at an arbitrary position while being opened due to friction between the door boss and the guide rail.

While the present invention has been particularly shown and described with reference to the preferred embodiments thereof, it will be appreciated that many variations, modifications, and other applications of the present invention may be made without affecting the spirit and scope.

What is claimed is:

1. A door mounting structure for covering a case, comprising:
   a case panel forming a part of the case;
   a door partially covering the case panel;
   at least one guide protrusion formed on the door; and
   at least one guide rail formed on the case panel, guiding the at least one guide protrusion to move the door along the case panel.

2. The door mounting structure as in claim 1, wherein said door is moved adjacently to a rear face of the case panel along to the guide rail.

3. The door mounting structure as in claim 2, wherein said guide protrusion rubs against a contact face between the guide protrusion and the guide rail, so that the door is fixed at arbitrary position.

4. The door mounting structure as in claim 3, further comprising a door boss formed between the at least one guide protrusion and the door, the door boss having a width greater than a width of the guide protrusion, and wherein the door boss causes friction by pressing circumference of the at least one guide rail so that the door is fixed at the arbitrary position.

5. The door mounting structure as in claim 4, wherein the at least one guide protrusion includes a first guide protrusion and a second guide protrusion apart from the first guide protrusion in the direction of the door movement, and the at least one guide rail includes first and second guide rails guiding the first and second guide protrusions, respectively.

6. The door mounting structure as in claim 1, further comprising a stopper formed in an end of the guide rail, and wherein the guide protrusion is fixed at the end of the guide rail by the stopper.

7. The door mounting structure as in claim 6, wherein the stopper includes a curved part formed by bending the end of the guide rail.

8. The door mounting structure as in claim 6, wherein the stopper includes an elastic part on the end of the guide rail and a protrusion formed in the elastic part.

* * * * *